United States Patent
Nishiura et al.

(10) Patent No.: US 6,758,383 B2
(45) Date of Patent: Jul. 6, 2004

(54) TRANSDUCER FOR A BONDING APPARATUS

(75) Inventors: Shinichi Nishiura, Fussa (JP); Kazuhiro Ootaka, Musashimurayama (JP)

(73) Assignee: Kabushiki Kaisha Shinkawa, Tokyo (JP)

( * ) Notice: Subject to any disclaimer, the term of this patent is extended or adjusted under 35 U.S.C. 154(b) by 0 days.

(21) Appl. No.: 10/283,833

(22) Filed: Oct. 30, 2002

(65) Prior Publication Data

US 2003/0080173 A1 May 1, 2003

(51) Int. Cl.$^7$ .......................... B23K 37/00; B23K 31/02
(52) U.S. Cl. .................... 228/4.5; 228/180.5; 228/1.1; 228/102; 156/73.1; 156/580.1
(58) Field of Search .................. 228/1.1, 110.1, 228/4.1, 6.1, 6.2, 47.1, 49.5; 156/73.1, 580.1

(56) References Cited

U.S. PATENT DOCUMENTS

| | | | | |
|---|---|---|---|---|
| 4,667,870 A | * | 5/1987 | Avedissian et al. | 228/103 |
| 4,838,964 A | * | 6/1989 | Thomsen et al. | 156/73.1 |
| 5,931,372 A | * | 8/1999 | Miller | 228/180.5 |
| 6,152,350 A | * | 11/2000 | Hayashi et al. | 228/102 |
| 6,247,628 B1 | * | 6/2001 | Sato et al. | 228/1.1 |
| 6,471,116 B2 | * | 10/2002 | Copperthite | 228/180.5 |
| 6,599,381 B2 | * | 7/2003 | Urlaub et al. | 156/73.1 |
| 2002/0056906 A1 | * | 5/2002 | Kajiwara et al. | 257/697 |
| 2003/0047583 A1 | * | 3/2003 | Kyomasu et al. | 228/1.1 |

FOREIGN PATENT DOCUMENTS

JP    11-307588    11/1999

* cited by examiner

Primary Examiner—L. Edmondson
(74) Attorney, Agent, or Firm—Koda & Androlia

(57) ABSTRACT

A transducer for, for instance, a flip-chip bonding apparatus. The transducer has a passage that communicates between a piping attachment and a suction holding port that suction-holds an object to be processed (bonded); and in this transducer, an air pressure piping used for the suction is fastened to the piping attachment with a connecting member in between, and this connecting member made of foam styrol suppresses effects of reaction force of the air pressure piping.

7 Claims, 6 Drawing Sheets

TRANSDUCER FOR A BONDING APPARATUS

BACKGROUND OF THE INVENTION

1. Field of the Invention

The present invention relates to a bonding apparatus and more particularly to a transducer used in a bonding apparatus.

2. Prior Art

A method that uses ultrasonic pressure welding is known as one of the methods for mounting electronic parts such as the one formed with bumps, etc. to lead frames, substrates, etc. In this ultrasonic pressure welding method, an ultrasonic vibration is applied while the bumps of the electronic parts are pressed against the substrate, thus bonding the joining surfaces by mutual friction between the surfaces.

So as to allow an continuous execution of the above-described bonding operation and a pre-bonding operation that mounts the electronic part (which is the object to be processed) in a specified position on the surface to which the electronic part is to be bonded, a transducer to which the ultrasonic vibration is fastened is provided with a passage that communicates between a piping attachment and a suction holding port which is used for suction holding the electronic part.

The suction holding port is, in order to cause the ultrasonic vibration to act efficiently on the electronic part, disposed at a position that corresponds to the crest of the ultrasonic vibration in the transducer. In other words, the suction holding port is provided in an area where the amplitude of the standing wave shows the maximum value. On the other hand, in order to avoid effects on the ultrasonic vibration, the air pressure piping that applies suction to the electronic part via the passage is disposed at a position that corresponds to the node of the ultrasonic vibration.

In such a construction as described above, however, the distance from the suction holding port to the air pressure piping is long. As a result, there is a specified time delay before the on-off switching of the negative pressure via the air pressure piping acts on the suction holding port. The operating response characteristics are thus poor. For solving this problem, in Japanese Patent Application Laid-Open (Kokai) No. H11-307588, the air pressure piping and transducer are designed so as to be connected and separated. However, this structure has drawbacks. The number of moving components is high, and the construction is thus complicated.

SUMMARY OF THE INVENTION

Accordingly, the object of the present invention is to provide a transducer that can suppresses the deleterious effects in terms of vibration characteristics that are exerted by the air pressure piping on the transducer.

The above object is accomplished by a unique structure for a transducer which is used in a bonding apparatus and has a passage communicating between a piping attachment and a suction holding port that suction-holds an object to be processed (or, for instance, to be bonded), the object to be processed being suction-held by suction applied via the passage; and in the present invention, an air pressure piping used for the suction is connected to the piping attachment by a connecting member that can suppresses effects (influence) of reaction force of the air pressure piping.

The above object is accomplished by another unique structure for a transducer which is used in a bonding apparatus and has a passage communicating between a piping attachment and a suction holding port that suction-holds an object to be processed (or, for instance, to be bonded), the object to be processed being suction-held by suction applied via the passage; and in the present invention, an air pressure piping used for the suction is connected to the piping attachment by a connecting member that is made of a foam resin material.

In the above structure of the present invention, the air pressure piping that is used for suction holding is connected to the piping attachment via a connecting member formed from a foam resin material. Accordingly, the effects of the reaction force from the air pressure piping on the ultrasonic vibration of the transducer can be effectively suppressed. The reason for this is, though unclear, that while the reaction force F is defined as F=ma+cv+kx (m is the mass, a is the acceleration, c is the viscosity coefficient, v is the velocity, k is the spring constant, and x is the displacement), the mass m and viscosity coefficient c of the connecting member made of a foam resin material are much smaller than those of a metal or non-foam resin material, so that the connecting member can suppress the effects of the reaction force on ultrasonic vibrations that have a large acceleration a and velocity V.

In the above structure, the foam resin material is an independent foam body.

Since the foam resin material is formed as an independent foam body, the air-tightness with respect to suction is ensured.

Furthermore, the foam resin material is a styrol resin.

Since the foam resin material is a styrol resin, the connecting member can be constructed especially inexpensively and with a light weight. Furthermore, since the amount of shrinkage with respect to the suction of air pressure devices such as a vacuum pump, etc. is small compared to that of a soft material such as a urethane resin, etc., there is no loss of the response characteristics of the suction holding operation.

In addition, the connecting member can be provided with an air-tight layer that is formed on an inner circumferential surface thereof so as to face the passage.

With the air-tight layer formed on the inner circumferential surface of the connecting member, the air-tightness of the connecting member is heightened even further.

Furthermore, in the present invention, the passage is provided within a specified range from a point of maximum amplitude of the transducer in the direction of length of the transducer.

By way of positioning the passage within a specified range that extends from the point of maximum amplitude of the transducer in the direction of length of the transducer, the distance from the suction holding port disposed at the point of maximum amplitude to the piping attachment can be shortened, and as a result the response characteristics of the suction operation is improved.

Furthermore, the passage is disposed in the direction perpendicular to the direction of length of the transducer.

Since the passage is disposed in the perpendicular direction to the direction of length of the transducer, the length of the passage can be minimized, and the response characteristics of the suction operation is improved.

In addition, the transducer can be provided with a vibrator at one end thereof and a weight that has a mass substantially equal to that of the vibrator at another end thereof.

With a vibrator at one end of the transducer and a weight having a mass that is substantially equal to that of the vibrator at other end, any mass imbalance in the transducer is suppressed, and the vibration transmission efficiency is improved.

BRIEF DESCRIPTION OF THE DRAWINGS

FIG. 7 is a graph showing the frequency-impedance characteristics of the transducer with a flexible tube made of hard nylon attached to the piping attachment with the connecting member in between.

DETAILED DESCRIPTION OF THE INVENTION

Figure 1:
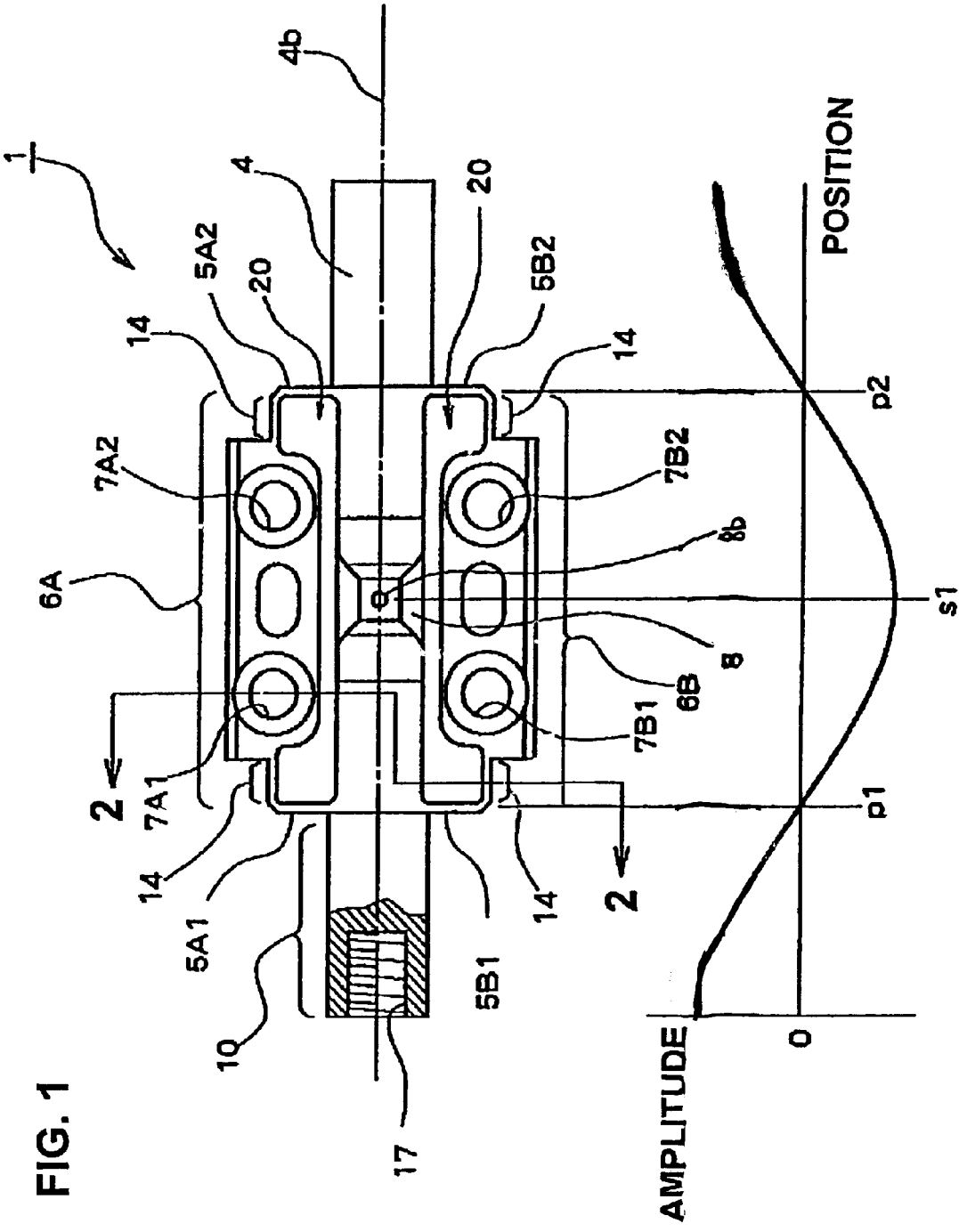
FIG. 1 shows the bottom of the transducer according to one embodiment of the present invention, a graph indicating the positions of the nodes of vibration being shown together.

Embodiments of the present invention will be described below with reference to the accompanying drawing. In the embodiment shown in FIG. 1, the present invention will be described on a transducer (or bonding horn) used in a flip-chip bonding apparatus.

The ultrasonic horn 1, which is the transducer in the present invention, includes a suction holding nozzle 8, a piping attachment 9 and connecting portions 6A and 6B (occasionally simply referred to as "connecting portions 6") which are all obtained by way of cutting from a round bar material and thus integrally formed by the same member as the horn main body 4.

Screw holes 7A1, 7A2, 7B1 and 7B2 (occasionally simply referred to as "screw holes 7") which are used to fasten the connecting portions 6A and 6B to a holder 30 of a bonding arm of the bonding apparatus (both not shown) are formed in the connecting portions 6A and 6B. Respective flat-plate-form thin portions 14 are formed in the front and rear portions of the connecting portions 6A and 6B. The thickness of the respective thin portions 14 is approximately 0.5 mm.

The lengths of the respective holding portions 5 (i.e., the lengths of these portions in the longitudinal direction in FIG. 1) are equal to each other. Also, the lengths of the connecting portion 6A and connecting portion 6B (i.e., the lengths of these portions in the lateral or left-right direction in FIG. 1) are equal to each other. Moreover, the screw holes 7A1 and 7A2 and the screw holes 7B1 and 7B2 are disposed in mutually symmetrical positions (i.e., in positions located at equal distances from the front ends or rear ends of the connecting portions 6). Furthermore, the connecting portions 6 (6A1 and 6B1) are disposed on the horizontal plane (line B—B in FIG. 2) that includes the axial center 4b of the ultrasonic horn 1.

Among the four holding portions 5A1, 5A2, 5B1 and 5B2 (occasionally simply referred to as "holding portions 5"), the holding portions 5A1 and 5B1 on the rear end of the horn main body 4 are disposed in the position that correspond to the first node p1 of the vibration of the horn (or the transducer) 1 from the base end of the horn main body (or the transducer main body) 4. The holding portions 5A2 and 5B2 on the front end of the horn main body 4 are disposed in the position that corresponds to the second node p2 of the vibration of the horn 1 from the base end of the horn main body 4. The thickness of the respective holding portions 5 is approximately 0.5 mm.

The suction holding nozzle 8 has a square pyramid shape, and the piping attachment 9 (see FIG. 3) has a cylindrical shape. A vertically oriented through-hole 8a is formed through the centers of the suction holding nozzle 8 and piping attachment 9. The lower end portion of the through-hole 8a is a chip suction holding port 8b.

As seen from FIG. 1, the chip suction holding port 8b is disposed at an intermediate point between the installation points of the two pairs of holding portions 5, and this chip suction holding port 8b is disposed so that the center of the port coincides with the vibration crest s1 (a part where the absolute value of the velocity shows the maximum value).

Figure 2:
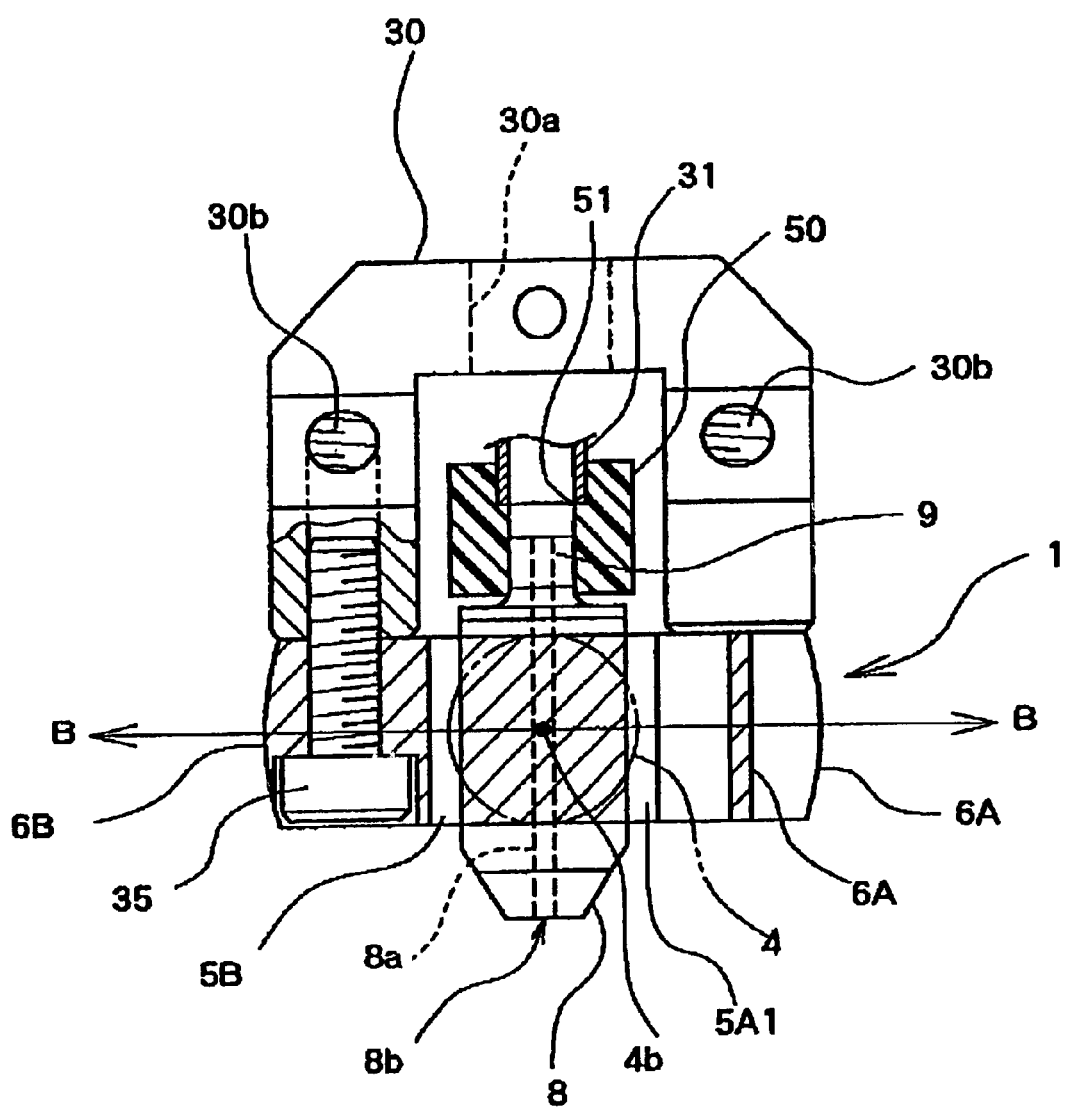
FIG. 2 is a sectional view taken along the line 2—2, the horn main body being mounted on a holder.
Figure 3:
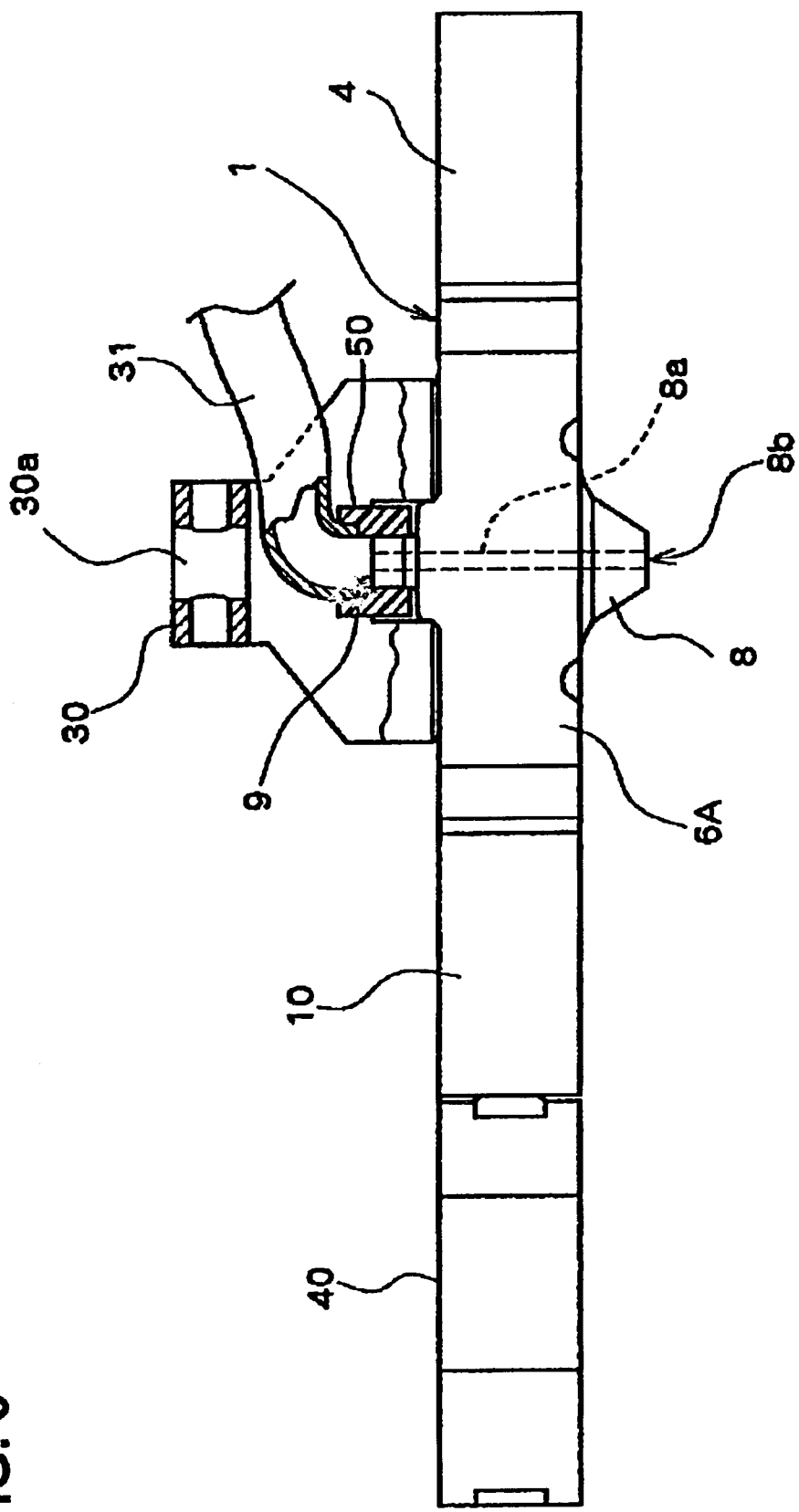
FIG. 3 is a front view of the horn main body.
Figure 4:
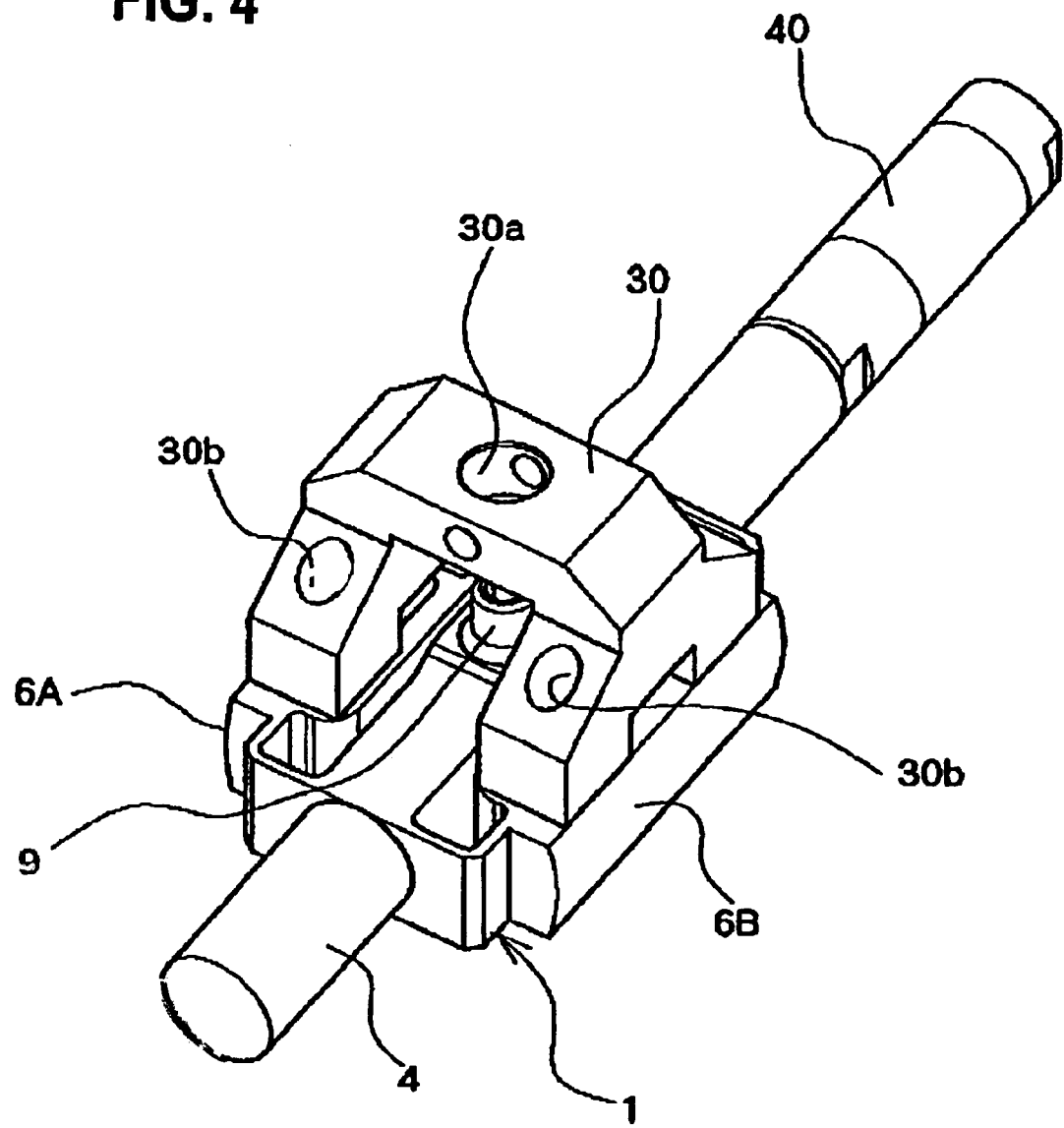
FIG. 4 is a perspective view of the horn main body mounted on the holder.

As seen shown from FIGS. 2 through 4, the ultrasonic horn 1 is screw-fastened to a holder 30 by bolts 35. In this holder 30, the left and right connecting portions 6 are integrally connected across the piping attachment 9, and the holder 30 is mounted to the bonding head driving mechanism of the boning apparatus (not shown) via the mounting hole 30a formed in the holder 30. The center of the mounting hole 30a is directly above the axial center 4b of the horn main body 4. Vertically oriented screw holes 30b, which are disposed in positions that correspond to the four through-holes 7 and engage with the bolts 35, are respectively formed in the holder 30. An ultrasonic vibrator 40 that has a known structure and is formed by electrostriction elements stacked in the axial direction is fastened in a screw hole 17 formed in the base end of the horn main body 4.

A connecting member 50 made of foam styrol is fastened to the piping attachment 9, and an air pressure piping 31 that is a flexible tube made of silicone rubber is connected at its one end to the upper end of the connecting member 50 (see FIG. 3, the connecting member 50 and air pressure piping 31 being omitted in FIG. 4). Thus, the piping attachment 9 and the air pressure piping 31 are connected to each other with the connecting member 50 in between.

The other end of the air pressure piping 31 is connected to a known air pressure circuit (not shown) that includes a vacuum pump, a solenoid valve, etc. (not shown), and suction in the interior of the air pressure piping 31 is selectively switched on and off by this air pressure circuit.

The connecting member 50 is formed by way of forming a foam styrol material, which is resin having foaming properties and independent foaming properties, into a substantially cylindrical shape. The connecting member 50 has a through-hole 51 at the center which extends axially and communicates with the through-hole 8a of the suction holding nozzle 8.

In the above embodiment, the ultrasonic horn 1 suction-holds a semiconductor device (not shown) at the suction holding port 8b by means of suction applied via the air pressure piping 31 and through-hole 8a and transports the semiconductor device to a bonding position, and the ultrasonic horn 1 is driven downward by the bonding head driving mechanism. Then, an ultrasonic vibration generated by the ultrasonic vibrator 40 is transmitted as a density wave (longitudinal wave) from the base end to the tip end of the ultrasonic horn 1, (i.e., along the central axis 4), and bonding is accomplished by this ultrasonic vibration and the load that is applied by the bonding head driving mechanism of the bonding apparatus.

In the above embodiment, the air pressure piping 31 used for suction is fastened to the piping attachment 9 via a connecting member 50 formed from a foam resin material. Accordingly, the effects of the reaction force from the air pressure piping 31 on the ultrasonic vibration of the ultrasonic horn 1 (or the transducer) can be effectively suppressed. The reason for this is believed such that while the reaction force F is defined as F=ma+cv+kx (m is the mass, a is the acceleration, c is the viscosity coefficient, v is the velocity, k is the spring constant, and x is the displacement), the mass m and viscosity coefficient c of the connecting member made of a foam resin material are much smaller than those of a metal or non-foam resin material, so that the connecting member can suppress the effects of the reaction force on ultrasonic vibrations that have a large acceleration a and velocity v.

Furthermore, in the above embodiment, the connecting member 50 is made of an independent foam material. Thus, air-tightness with respect to suction is ensured.

Moreover, since the connecting member 50 is made of a styrol resin, the connecting member can be manufactured especially inexpensively and has a light weight. Furthermore, the styrol resin used for the connecting member 50 is small in the amount of shrinkage with respect to the suction of an air pressure apparatus such as a vacuum pump compared to that of a soft material such as a urethane resin. Accordingly, the response characteristics of the suction holding operation will not be lost.

Furthermore, in the above embodiment, the through-hole 8a which acts as a passage of suction force positionally coincide with the point of maximum amplitude of the ultrasonic horn 1 (crest s1 of the vibration) and is disposed in a direction perpendicular to the length of the ultrasonic horn 1. Accordingly, the path from the suction holding hole 8b to the piping attachment 9 is extremely short, and the response characteristics of the suction operation is improved.

Figure 5:
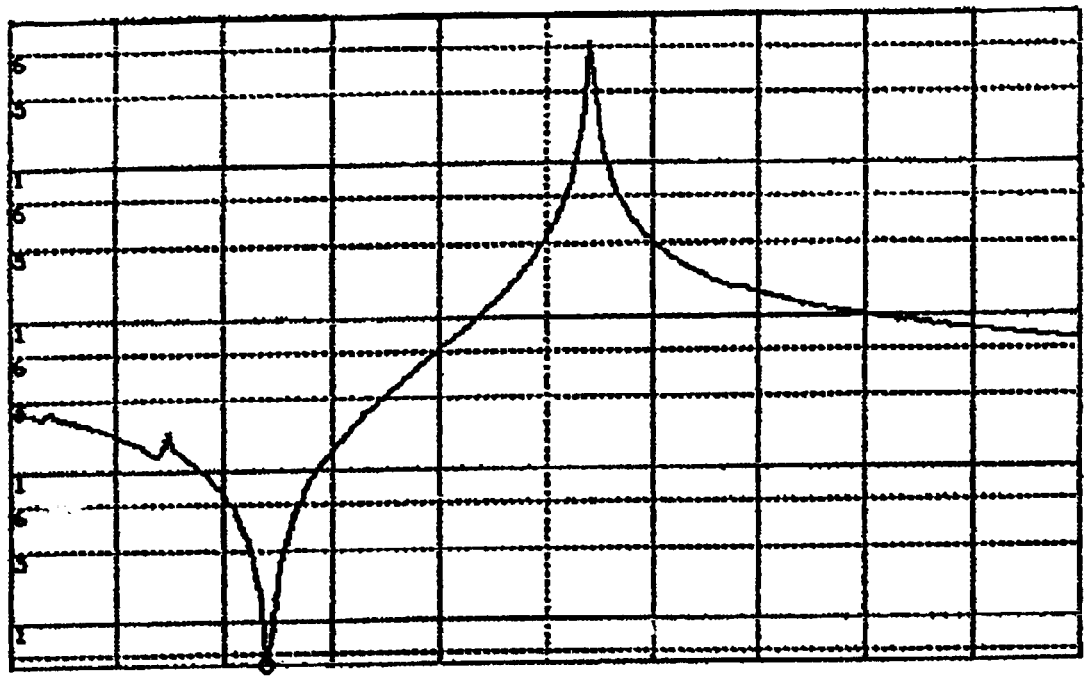
FIG. 5 is a graph showing the frequency-impedance characteristics of the transducer with no air pressure piping attached to the piping attachment.
Figure 6:
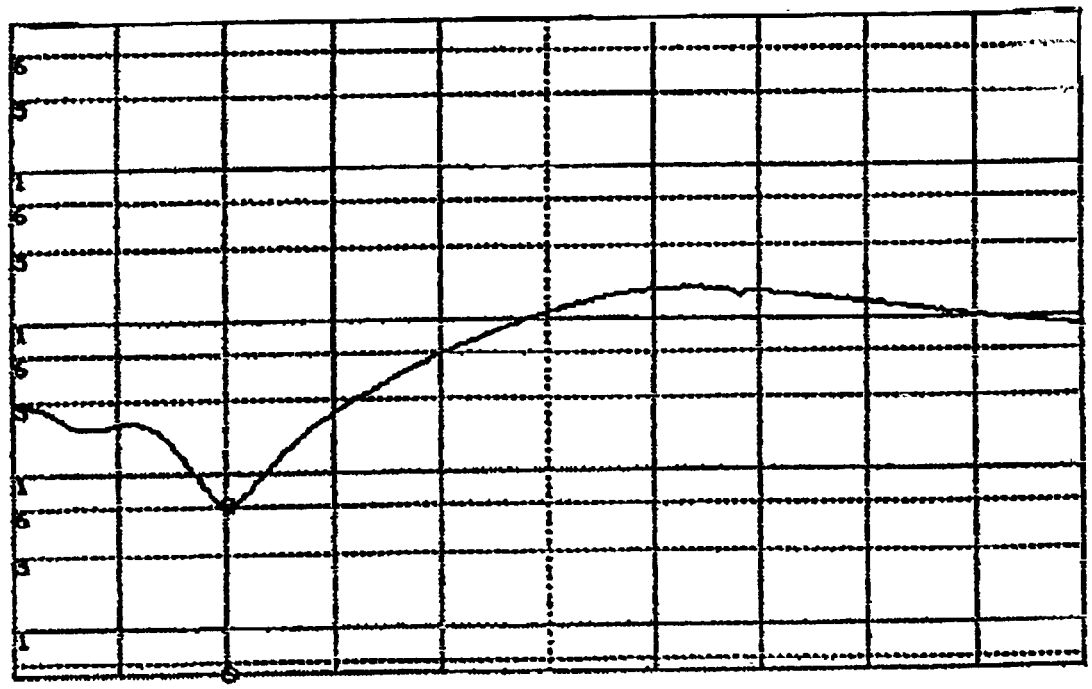
FIG. 6 is a graph showing the frequency-impedance characteristics of the transducer with a flexible tube made of hard nylon attached directly to the piping attachment.
Figure 7:
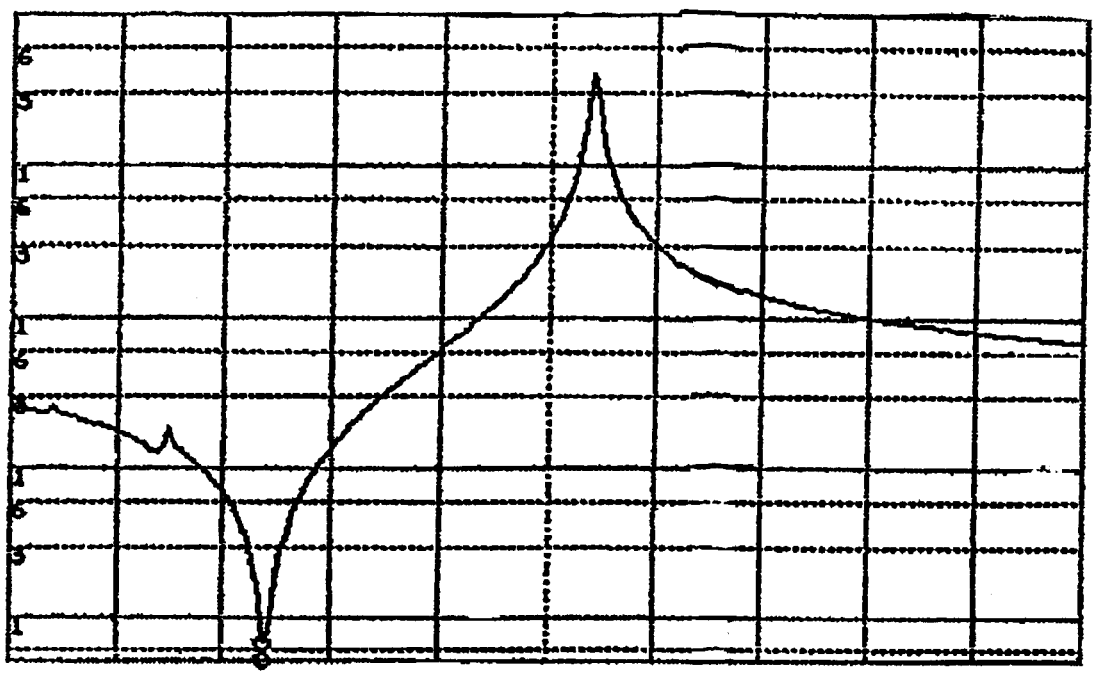

The graphs in FIGS. 5 through 7 show the advantages provided by the transducer of the present invention. In these graphs, the horizontal axis represents the frequency, and the vertical axis represents the impedance of the ultrasonic vibrator 40.

FIG. 5 shows a case in which nothing is attached to the piping attachment 9. In other words, an air pressure piping is not connected to the suction holding nozzle 8. Since an abrupt peak is present at a particular frequency, it can be seen that a clear standing wave is generated.

FIG. 6 shows as a control experiment a case in which a flexible tube made of hard nylon (that is ordinarily used in air pressure piping of this type) is directly attached to the piping attachment 9, but the connecting member 50 is not used. The graph of FIG. 6 shows that the standing wave is indistinct. Thus, it can be seen that the reaction force of the flexible tube made of hard nylon has a deleterious effect on the vibration characteristics.

FIG. 7 shows the case in which, as described in the above embodiment, a flexible tube made of hard nylon is attached to the piping attachment 9 with the connecting member 50 in between. It can be confirmed that vibration characteristics showing almost no difference from those obtained in the case of FIG. 5 are obtained.

As for the connecting member 50, an air-tight layer made of a non-foam resin can be formed on the inner surface of the through-hole 51 of the connecting member 50. With the air-tight layer, the air-tightness of the connecting member 50 is further improved, and the response characteristics of the suction operation are also further improved.

In the above-described embodiment, the ultrasonic vibrator 40 is attached to one end of the ultrasonic horn 1 with respect to the direction of length of the ultrasonic horn 1, and no particular part is attached to the other end. However, a weight with a mass substantially equal to that of the ultrasonic vibrator 40 can be attached to the other end of the ultrasonic horn 1. In this structure, an imbalance in the mass of the ultrasonic horn 1 is suppressed, and the vibration transmission efficiency is improved.

The above embodiments are described with reference to a flip-chip bonding apparatus. However, the present invention is not limited to such bonding apparatuses. The present invention is applicable to various other types of processing apparatuses that execute particular processing by the vibration of a transducer, and all of such applications are included in the scope of the present invention. Furthermore, the shape of the transducer is likewise not limited to the shape shown in the above embodiments. Various shapes may be selected for the transducer in accordance with the application and purpose thereof.

What is claimed is:

1. A transducer for a bonding apparatus, said transducer being provided with a passage which communicates between a piping attachment and a suction holding port that suction-holds an object to be processed, said object to be processed being suction-held by suction applied via said passage, wherein an air pressure piping used for said suction is fastened to said piping attachment with a connecting member in between, said connecting member being made of a foam resin material.

2. The transducer according to claim 1, wherein said foam resin material is an independent foam body.

3. The transducer according to claim 1, wherein said foam resin material is a styrol resin.

4. The transducer according to claim 1, wherein said connecting member is provided with an air-tight layer formed on an inner circumferential surface thereof that faces said passage.

5. The transducer according to claim 1, wherein said passage is provided within a specified range from a point of maximum amplitude of vibration of said transducer in a direction of length of said transducer.

6. The transducer according to claim 1, wherein said passage is disposed in a direction perpendicular to a direction of length of said transducer.

7. The transducer according to claim 1, wherein a vibrator is provided at one end of said transducer, and a weight having a mass that is substantially equal to that of said vibrator is installed at another end of said transducer.

* * * * *

UNITED STATES PATENT AND TRADEMARK OFFICE
CERTIFICATE OF CORRECTION

PATENT NO.    : 6,758,383 B2
DATED         : July 6, 2004
INVENTOR(S)   : Shinichi Nishiura et al.

It is certified that error appears in the above-identified patent and that said Letters Patent is hereby corrected as shown below:

<u>Title page,</u>
Item [30], Foreign Application Priority Data, add:
-- November 1, 2001   (JP)   ……. 2001-336011--.

Signed and Sealed this

Thirteenth Day of June, 2006

JON W. DUDAS
*Director of the United States Patent and Trademark Office*